(12) United States Patent
Hsu

(10) Patent No.: US 6,569,745 B2
(45) Date of Patent: May 27, 2003

(54) SHARED BIT LINE CROSS POINT MEMORY ARRAY

(75) Inventor: Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 09/965,586

(22) Filed: Sep. 26, 2001

(65) Prior Publication Data

US 2003/0003675 A1 Jan. 2, 2003

Related U.S. Application Data

(63) Continuation-in-part of application No. 09/893,830, filed on Jun. 28, 2001, and a continuation-in-part of application No. 09/894,922, filed on Jun. 28, 2001.

(51) Int. Cl.[7] .............................................. H01L 21/20
(52) U.S. Cl. ........................ 438/385; 438/238; 438/386
(58) Field of Search ................................ 438/238, 385, 438/386; 365/103, 145

(56) References Cited

U.S. PATENT DOCUMENTS

| | | | | |
|---|---|---|---|---|
| 5,991,188 A | * | 11/1999 | Chung et al. | 365/145 |
| 6,034,882 A | * | 3/2000 | Johnson et al. | 365/103 |
| 6,128,214 A | | 10/2000 | Kuekes et al. | 365/151 |
| 6,204,139 B1 | | 3/2001 | Liu et al. | 438/385 |

OTHER PUBLICATIONS

US 2002/0075719, Yamada et al. Apr. 18, 2002.*
US 2002/0043680, Johnson et al., Jun. 18, 2002.*
Article entitled, "Electric–pulse–induced reversible resistance change effect in magnetoresistive films", by S. Q. Liu et al., published in Applied Physics Letters, vol. 76, No. 19, May 8, 2000, pp 2749–2751.
Article entitled, "Reproducible Switching Effect in Thin Oxide Films for Memory Applications", by A. Beck et al., published in Applied Physics Letters, vol. 77, No. 1, Jul. 3, 2000, pp. 139–141.

* cited by examiner

Primary Examiner—David Nelms
Assistant Examiner—Dao H. Nguyen
(74) Attorney, Agent, or Firm—Matthew D. Rabdau; David C. Ripma; Scott C. Krieger

(57) ABSTRACT

A shared bit line cross point memory array structure is provided, along with methods of manufacture and use. The memory structure comprises a bottom word line with a top word line overlying the bottom word line. A bit line is interposed between the bottom word line and the top word line such that a first cross point is formed between the bottom word line and the bit line and a second cross point is formed between the bit line and the top word line. A material having a property, for example resistance, that can be changed in response to an input voltage is provided at each cross point above and below the bit line.

20 Claims, 3 Drawing Sheets

SHARED BIT LINE CROSS POINT MEMORY ARRAY

CROSS-REFERENCES

This application is a continuation-in-part of U.S. patent application Ser. No. 09/893,830, filed Jun. 28, 2001, entitled Low Cross-talk Electrically Programmable Resistance Cross Point Memory and of U.S. patent application Ser. No. 09/894,922, also filed Jun. 28, 2001, entitled Electrically Programmable Resistance Cross Point Memory. Both of these applications are incorporated herein by reference.

BACKGROUND OF THE INVENTION

This invention relates to nonvolatile memory, and more particularly to a cross point memory structure.

Materials having a perovskite structure, among them colossal magnetoresistance (CMR) materials and high temperature superconductivity (HTSC) materials are materials that have electrical resistance characteristics that can be changed by external influences.

For instance, the properties of materials having perovskite structures, especially for CMR and HTSC materials, can be modified by applying one or more short electrical pulses to a thin film or bulk material. The electric field strength or electric current density from the pulse, or pulses, is sufficient to switch the physical state of the materials so as to modify the properties of the material. The pulse is of low enough energy so as not to destroy, or significantly damage, the material. Multiple pulses may be applied to the material to produce incremental changes in properties of the material. One of the properties that can be changed is the resistance of the material. The change may be at least partially reversible using pulses of opposite polarity from those used to induce the initial change.

Cross point memory arrays along with their accompanying read out circuits can use a significant amount of chip surface area. The reduction in chip size has a corresponding economic benefit.

SUMMARY OF THE INVENTION

Accordingly, a memory structure is provided, which reduces the area needed for a cross point array and accompanying read out circuits. By sharing each bit line with two sets of word lines, the area of each cross point can hold two bits instead of one, and the number of read out circuits is reduced since the number of bit lines per bit is reduced.

A shared bit line cross point memory array structure is provided, along with methods of manufacture and use. The memory structure comprises a bottom word line with a top word line overlying the bottom word line. A bit line is interposed between the bottom word line and the top word line such that a first cross point is formed between the bottom word line and the bit line and a second cross point is formed between the bit line and the top word line. A material having a property, for example resistance, that can be changed in response to an input voltage is provided at each cross point above and below the bit line.

Each bit can be programmed by applying a voltage signal between the bit line and the appropriate word line while leaving other word lines floating. Likewise, the bit can be read by applying a read voltage to the desired word line and reading the signal off of the bit line. A block erase can also be achieved by ground all word lines and applying an erase voltage signal to one, or more, bit lines.

DETAILED DESCRIPTION OF THE INVENTION

Figure 1:
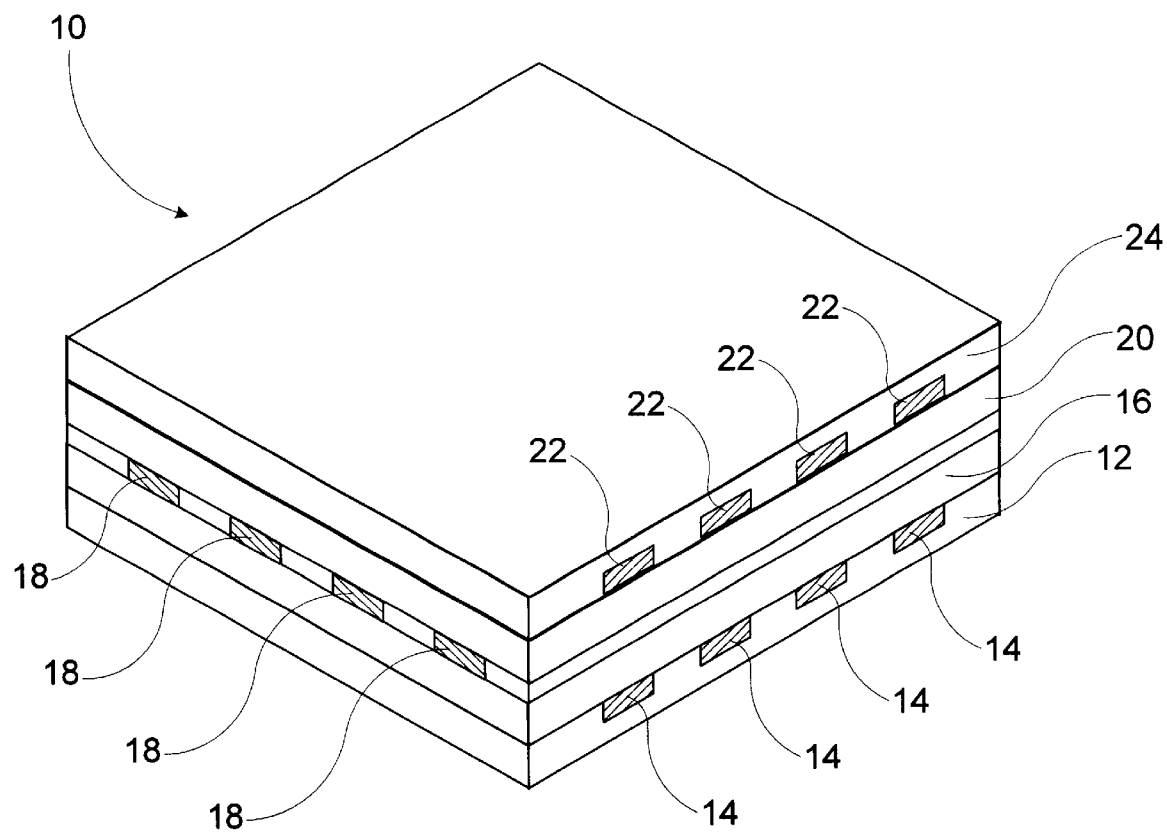
FIG. 1 is an isometric view of a cross point memory array area with a shared bit line.

FIG. 1 is an isometric drawing illustrating a shared bit line cross point memory array area 10. An embodiment of the memory array area 10 comprises a substrate 12 with a plurality of bottom word lines 14 formed thereon. A layer of oxide 16 overlies the substrate 12 and bottom word lines 14. A plurality of bit lines 18 overly the layer of oxide 16. A second layer of oxide 20 overlies the plurality of bit lines 18. A plurality of top word lines 22 overly the second layer of oxide 20. A passivation layer 24 overlies the plurality of top word lines 22. As is apparent from the isometric view, a cross point configuration is formed between the bottom word lines and the bit lines, as well as, between the top word lines and the bit lines. In this way two sets of word lines share a single set of bit lines. In a low cross talk version, the layer of oxide 16 would be etched so that a perovskite material could be deposited connecting the plurality of bottom word lines 14 to the plurality of bit lines 18 at each cross point. A similar structure could be formed between the bit lines and the plurality of top word lines. Alternatively, continuous active regions could be used in place of the layer of oxide 16 and the second layer of oxide 20.

Note that the terms "top" and "bottom" are for ease of explanation with respect to the drawings and should not be construed as requiring a specific orientation. The device can assume any spatial orientation during manufacture and operation.

FIG. 1 shows just the memory array area. It should be clear that in an actual device, the substrate 12, the bottom word lines 14, the bit lines 18, and the top word lines 22 may extend well beyond the memory array area to other areas containing other device structures.

Figure 2:
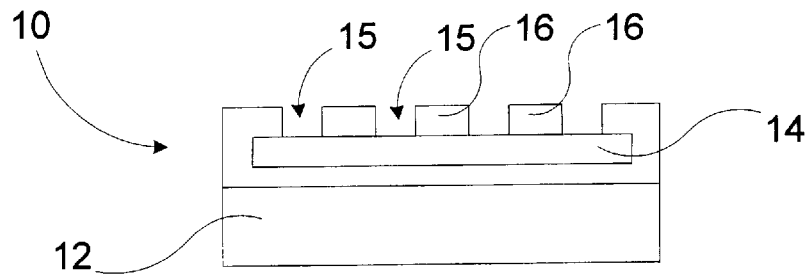
FIG. 2 is a cross sectional view of a memory structure during processing.

A method for forming a low cross talk resistive memory array is provided. FIG. 2 shows a cross-sectional view of a cross point memory array area 10 following some initial processing. The memory array area 10 comprises a substrate 12 with a bottom word line 14 formed thereon. A layer of oxide 16, which is deposited over the substrate to a thickness of between approximately 500 nm and 1000 nm above the bottom word line 14, is planarized to a thickness of between approximately 50 nm and 500 nm over the bottom word line. The layer of oxide 16 is etched to form openings 15 to allow access to the bottom word line 14.

The substrate 12 is any suitable substrate material, whether amorphous, polycrystalline or crystalline, such as $LaAlO_3$, Si, $SiO_2$, TiN or other material.

The bottom word lines 14 are made of conductive oxide or other conductive material. In a preferred embodiment, the conductive material is a material, such as $YBa_2Cu_3O_7$ (YBCO), that allows the epitaxial growth of an overlying perovskite material. In another preferred embodiment, the conductive material is platinum or iridium. The bottom word lines are a thickness in the range of between about 5 nm and about 500 nm.

Figure 3:
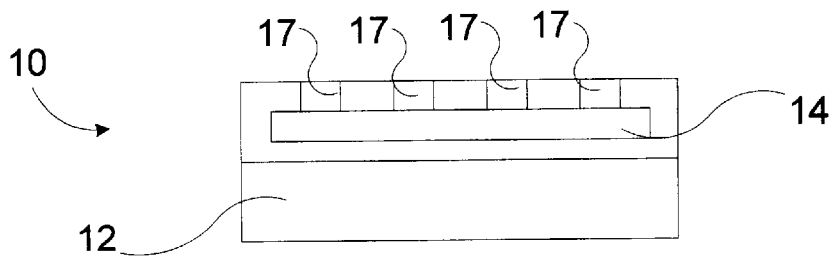
FIG. 3 is a cross sectional view of a memory structure during processing.

Referring now to FIG. 3, a layer of perovskite material 17 is deposited over the oxide 16 to fill the openings 15. The perovskite material 17 is a material capable of having its resistivity changed in response to an electrical signal. The perovskite material is preferably a colossal magnetoresistive (CMR) material or a high temperature superconducting (HTSC) material, for example $Pr_{0.7}Ca_{0.3}MnO_3$ (PCMO). Another example of a suitable material is $Gd_{0.7}Ca_{0.3}BaCo_2O_{5+5}$. The perovskite material is preferably between about 50 nm and 500 nm thick following polishing. The perovskite material 17 can be deposited using any suitable deposition technique including pulsed laser deposition, rf-sputtering, e-beam evaporation, thermal evaporation, metal organic deposition, sol gel deposition, and metal organic chemical vapor deposition. The perovskite material is preferably polished using CMP.

Figure 4:
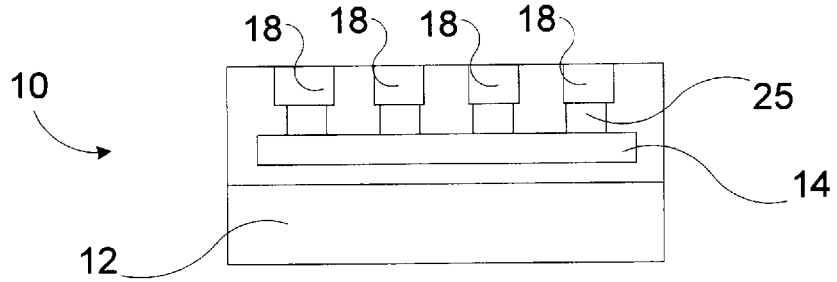
FIG. 4 is a cross sectional view of a memory structure during processing.

FIG. 4 shows the memory array area 10 following deposition and patterning of bit lines 18. The bit lines 18 comprise a conductive material, preferably YBCO, platinum, iridium, copper, silver, or gold. The perovskite material that is now interposed between the bottom word line 14 and the bit lines 18 is now a set of resistive memory bits 25.

Figure 5:
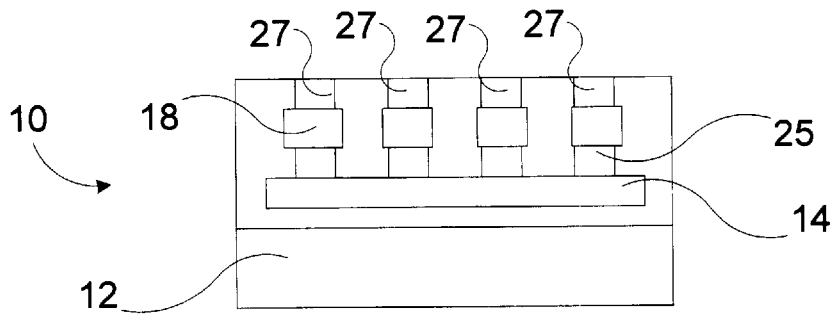
FIG. 5 is a cross sectional view of a memory structure during processing.

FIG. 5 the memory area 10 following deposition of a second oxide layer 20, patterning, deposition and polishing of perovskite material 27. The process is similar to that described above in connection with FIG. 3.

Figure 6:
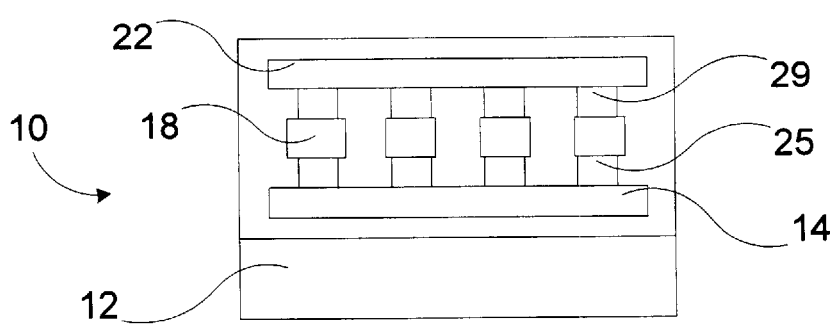
FIG. 6 is a cross sectional view of a memory structure during processing.

FIG. 6 shows a memory array area 10 following formation of a top word line 22, and passivation of the memory array area. The perovskite material that is now interposed between the top word line 22 and the bit lines 18 is now a second set of resistive memory bits 29. The top word lines 22 and the bottom word lines 14 are each preferably substantially parallel rows. The top word lines 22 and the bottom word lines 14 are arranged in a cross point arrangement with respect to the bit lines 18, such that they each cross the bit lines in a regular pattern. A cross point refers to each position where a word line, either a top word line or a bottom word line, crosses a bit line. As shown, the word lines and the bit lines are arranged at substantially 90 degrees with respect to each other. Although as shown and described the top word lines and the bottom word lines are directly aligned with respect to each other, it is also possible to have them offset with respect to each other. In which case, any bit formed between the bottom word line and the bit line would not be aligned with a corresponding bit formed between the bit line and the top word line.

In a preferred embodiment of the present method, one, or more, of transistor structures, interconnects or other components of a memory circuit may be formed prior to the formation of the memory array area 10. By forming components of the memory circuit prior to the memory array area 10, possible degradation of the perovskite material due to subsequent processing is reduced, or eliminated.

FIGS. 7 through 11 illustrate another embodiment of a shared bit line memory structure and method of processing.

Figure 7:
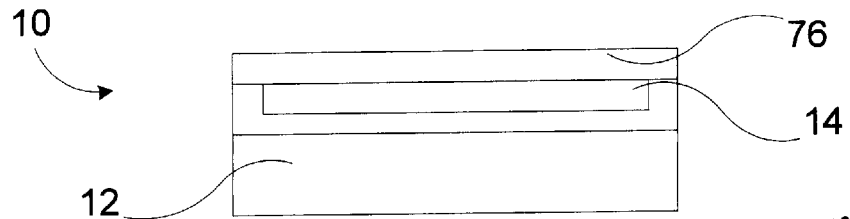
FIG. 7 is a cross sectional view of a memory structure during processing.
Figure 8:
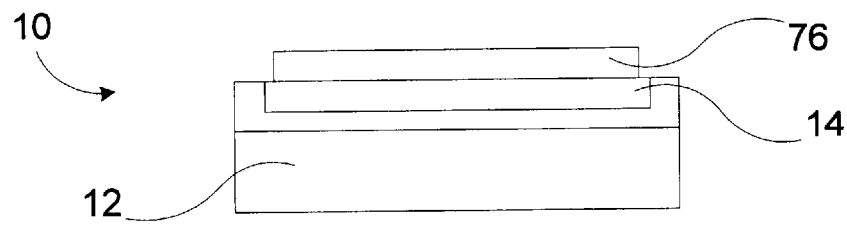
FIG. 8 is a cross sectional view of a memory structure during processing.

FIG. 7 shows a cross-sectional view of a cross point memory array area 10 following some initial processing. The memory array area 10 comprises a substrate 12 with a bottom word line 14 formed thereon. A first layer of active material 76 is deposited over the bottom word line. The active material is preferably a perovskite material, such as a colossal magnetoresistive (CMR) material or a high temperature superconducting (HTSC) material, for example $Pr_{0.7}Ca_{0.3}MnO_3$ (PCMO). Another example of a suitable material is $Gd_{0.7}Ca_{0.3}BaCo_2O_{5+5}$. The first layer of active material 76 is preferably between about 5 nm and 500 nm thick. The active material can be deposited using any suitable deposition technique including pulsed laser deposition, rf-sputtering, e-beam evaporation, thermal evaporation, metal organic deposition, sol gel deposition, and metal organic chemical vapor deposition. The active material is removed from outside the memory array area by ion milling or other suitable process as shown in FIG. 8. It is also possible to form a large recessed area to deposit perovskite material over and then use chemical mechanical polishing (CMP) to form the first layer of active material 76.

Figure 9:
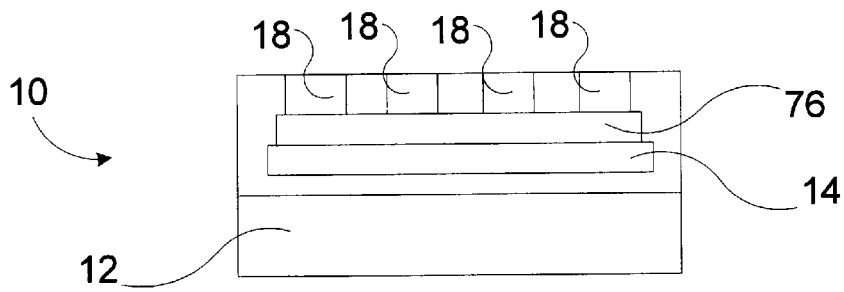
FIG. 9 is a cross sectional view of a memory structure during processing.

FIG. 9 shows the memory array area 10 following the formation of bit lines 18. The bit lines 18 are formed by depositing a layer of oxide and patterning it to form openings to the first layer of active material 76. A suitable conductive material is then deposited and polished forming the bit lines 18.

Figure 10:
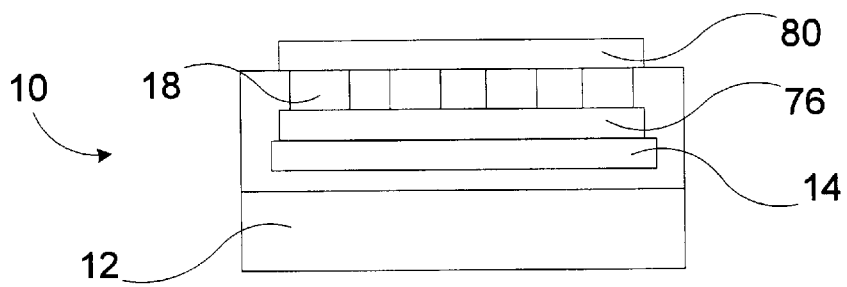
FIG. 10 is a cross sectional view of a memory structure during processing.

FIG. 10 shows the memory array area 10 following the deposition and patterning of a second layer of active material 80. The second layer of active material 80 is formed using a method described above in connection with the formation of the first layer of active material 76.

Figure 11:
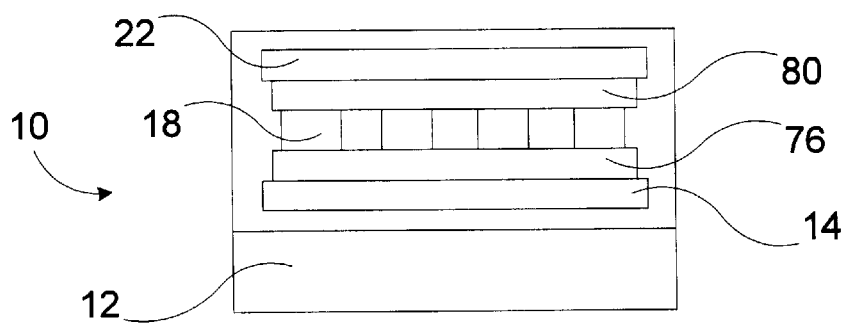
FIG. 11 is a cross sectional view of a memory structure during processing.

FIG. 11 shows the memory array area 10 following formation of the top word line 22 and deposition of a passivation oxide 90. Each top word line 22 forms a cross point with each bit line 18. The second layer of active material is a high resistivity material as formed. An upper resistive bit can be formed at each cross point by applying a voltage signal between each word line and each bit line to convert a region of active material to a low resistance state. Likewise a lower resistive bit can be formed between a bottom word line and a bit line. Each region at a cross point generally corresponds to a bit.

The bit lines also form a cross point array with the bottom word lines. By applying voltage signals a lower set of resistive bits can be formed. Each bit line will then have an upper set of resistive bits connected to one of the top word lines, and a lower set of resistive bits connected to one of the bottom word lines. This allows two sets of word lines to share a single set of bit lines. This also allows fewer bit line read circuits to be used for a given number of desired bits.

Once a device is completed and in operation, it can be programmed and read. The resistivity of each bit may be changed to program, or erase, a single bit. The resistivity is changed by applying a programming voltage between one word line and one bit line, while allowing the remaining word lines to float so that no signal flows between other word lines and the bit line. This includes setting the bottom word line to float when the programming voltage is on a top word line, or vice versa. This allows an upper bit for example to be programmed without affecting a lower bit.

The programming voltage is a voltage capable of changing the resistivity of a bit without damaging the bit. In some cases, it may not be able to apply fixed voltage capable of changing the resistivity of the bit without damaging the bit. The programming voltage may need to be a series of voltage pulses which can change the resistivity without damaging the bit.

Once a bit is programmed, it would be useful to be able to read the bit. The bit can be read by applying a voltage across a word line and a bit line while allowing the remaining word lines to float so that not current flows between the bit line and the remaining word lines. The output of the bit is then read at the bit line using a read out circuit.

It would also be possible to set all bits along a single bit line to the same resitance state, high or low, by grounding all the word lines, top and bottom, and applying a programming voltage to at least one bit line. If a programming voltage is applied to all bit lines a blanket programming of all the bits would be achieved effectively simultaneously. This may be useful for achieving a block erase.

Although a preferred embodiment, and other embodiments have been discussed above, the coverage is not limited to these specific embodiments. Rather, the claims shall determine the scope of the invention.

What is claimed is:

1. A method of manufacturing a memory structure comprising the steps of:
   a) providing a semiconductor substrate;
   b) forming a plurality of bottom word lines;
   c) depositing an isolation material overlying the bottom word lines;
   d) etching an opening to the bottom word lines;
   e) depositing a first layer of perovskite material overlying the bottom word lines and the isolation material;
   f) polishing the first layer of perovskite material, whereby perovskite material remains within the opening to form resistive bits;
   g) forming a plurality of bit lines overlying the layer of perovskite material;
   h) depositing an additional isolation material layer overlying the bit lines;
   i) etching another opening to the plurality of bit lines;
   j) depositing a second layer of perovskite material overlying the bit lines and the isolation material;
   k) polishing the second layer of perovskite material, whereby perovskite material remains to form resistive bits; and
   l) forming a plurality of top word lines overlying the layer of perovskite material.

2. The method of claim 1, wherein the bottom word lines comprise an electrode material that allows for epitaxial formation of the layer of perovskite material overlying the bottom word lines.

3. The method of claim 2, wherein the bottom word lines material is YBCO.

4. The method of claim 1, wherein the bottom word lines material is platinum or iridium.

5. The method of claim 1, wherein the isolation material is silicon dioxide.

6. The method of claim 1, wherein the perovskite material is a colossal magnetoresistance (CMR) material.

7. The method of claim 1, wherein the perovskite material is $Pr_{0.7}Ca_{0.3}MnO_3$ (PCMO).

8. The method of claim 1, wherein the perovskite material is $Gd_{0.7}Ca_{0.3}BaCo_2O_{5+5}$.

9. The method of claim 1, wherein the step of polishing the perovskite material comprises chemical mechanical polishing.

10. The method of claim 1, wherein the plurality of bit lines overly the plurality of bottom word lines forming a cross point memory configuration.

11. The method of claim 1, wherein the plurality of top word lines overly the plurality of bit lines forming a cross point memory configuration.

12. The method of claim 1, further comprising forming a memory circuit prior to depositing the layer of perovskite material.

13. A method of manufacturing a memory structure comprising the steps of:
   a) providing a semiconductor substrate;
   b) forming a plurality of bottom word lines;
   c) depositing a first layer of perovskite material overlying the bottom word lines;
   d) removing the first layer of perovskite material from regions outside a memory array area, whereby the first layer of perovskite material remains within the memory array area;
   e) forming a plurality of bit lines overlying the layer of perovskite material;
   f) depositing a second layer of perovskite material overlying the plurality of bit lines; and
   g) removing the second layer of perovskite material from regions outside the memory array area, whereby the second layer of perovskite material remains within the memory array area.

14. The method of claim 13, wherein the bottom word lines comprise a bottom electrode material that allows for epitaxial formation of the layer of perovskite material overlying the bottom electrodes.

15. The method of claim 14, wherein the bottom electrode material is YBCO.

16. The method of claim 13, wherein the bottom word lines are platinum or iridium.

17. The method of claim 13, wherein the perovskite material is a colossal magnetoresistance (CMR) material.

18. The method of claim 13, wherein the perovskite material is $Pr_{0.7}Ca_{0.3}MnO_3$ (PCMO).

19. The method of claim 13, wherein the perovskite material is $Gd_{0.7}Ca_{0.3}BaCo_2O_{5+5}$.

20. The method of claim 13, wherein the bit lines overly the bottom word lines forming a cross point memory configuration and the top word lines overly the bit lines forming a cross point memory configuration.

* * * * *